(12) United States Patent
Levy et al.

(10) Patent No.: US 11,205,535 B2
(45) Date of Patent: Dec. 21, 2021

(54) OXIDE INTERFACE DISPLAYING ELECTRONICALLY CONTROLLABLE FERROMAGNETISM

(71) Applicant: University of Pittsburgh—Of the Commonwealth System of Higher Education, Pittsburgh, PA (US)

(72) Inventors: Jeremy Levy, Pittsburgh, PA (US); Feng Bi, Pittsburgh, PA (US); Patrick R. Irvin, Allison Park, PA (US)

(73) Assignee: University of Pittsburgh—Of the Commonwealth System of Higher Education, Pittsburgh, PA (US)

( * ) Notice: Subject to any disclaimer, the term of this patent is extended or adjusted under 35 U.S.C. 154(b) by 0 days.

(21) Appl. No.: 16/661,908

(22) Filed: Oct. 23, 2019

(65) Prior Publication Data

US 2020/0126705 A1    Apr. 23, 2020

Related U.S. Application Data

(60) Continuation of application No. 15/806,169, filed on Nov. 7, 2017, now Pat. No. 10,490,331, which is a
(Continued)

(51) Int. Cl.
*G11C 11/16* (2006.01)
*G11C 11/155* (2006.01)
(Continued)

(52) U.S. Cl.
CPC ............ *H01F 13/00* (2013.01); *G11C 11/155* (2013.01); *G11C 11/161* (2013.01);
(Continued)

(58) Field of Classification Search
None
See application file for complete search history.

(56) References Cited

U.S. PATENT DOCUMENTS 6,130,814 A * 10/2000 Sun .................... B82Y 25/00
257/E43.004
9,852,835 B2    12/2017 Levy
(Continued)

OTHER PUBLICATIONS

Ohtomo et al., "A high-mobility electron gas at the LaAlO$_3$/SrTiO$_3$ heterointerface", Nature, vol. 427, pp. 423-426 (2004).
(Continued)

*Primary Examiner* — Kevin M Bernatz
(74) *Attorney, Agent, or Firm* — Foley & Lardner LLP

(57) ABSTRACT

A structure includes an electronically controllable ferromagnetic oxide structure that includes at least three layers. The first layer comprises STO. The second layer has a thickness of at least about 3 unit cells, said thickness being in a direction substantially perpendicular to the interface between the first and second layers. The third layer is in contact with either the first layer or the second layer or both, and is capable of altering the charge carrier density at the interface between the first layer and the second layer. The interface between the first and second layers is capable of exhibiting electronically controlled ferromagnetism.

17 Claims, 5 Drawing Sheets

Related U.S. Application Data division of application No. 14/801,410, filed on Jul. 16, 2015, now Pat. No. 9,852,835.

(60) Provisional application No. 62/025,815, filed on Jul. 17, 2014.

(51) Int. Cl.

| | | |
|---|---|---|
| *H01F 10/06* | (2006.01) | |
| *H01F 10/32* | (2006.01) | |
| *H01F 10/193* | (2006.01) | |
| *H01F 13/00* | (2006.01) | |
| *H01F 1/40* | (2006.01) | |

(52) U.S. Cl.
CPC .......... *G11C 11/1675* (2013.01); *H01F 1/40* (2013.01); *H01F 10/06* (2013.01); *H01F 10/193* (2013.01); *H01F 10/3213* (2013.01)

(56) References Cited

U.S. PATENT DOCUMENTS

| | | |
|---|---|---|
| 2004/0021397 A1 | 2/2004 | Srinivasan |
| 2007/0058302 A1 | 3/2007 | Tokura et al. |
| 2007/0279972 A1* | 12/2007 | Higo ............... G11C 11/155 365/158 |
| 2008/0089118 A1* | 4/2008 | Kajiyama .......... G11C 11/16 365/158 |
| 2011/0308580 A1 | 12/2011 | Seidel et al. |
| 2012/0058323 A1 | 3/2012 | Driscoll et al. |
| 2014/0312385 A1 | 10/2014 | Sluka et al. |
| 2018/0096792 A1 | 4/2018 | Shukh |
| 2018/0337238 A1 | 11/2018 | Eom |

OTHER PUBLICATIONS

Reyren et al., "Superconducting Interfaces Between Insulating Oxides", Science, vol. 317, pp. 1196-1199 (2007).
Shalom et al., "Tuning spin-orbit coupling and superconductivity at the $SrTiO_3/LaAlO_3$ interfaces: a magneto-transport study," Phys. Rev. Lett., 104, 5 pages (2010).
Brinkman et al., "Magnetic effects at the interface between non-magnetic oxides," Nature Materials, vol. 6, pp. 493-496 (2007).
Fitzsimmons et al., "Upper Limit to Magnetism in $LaAlO_3/SrTiO_3$ Heterostructures," Phys. Rev. Lett., vol. 107, pp. 217201-1-217201-5 (2011).
Salman et al., "Nature of Weak Magnetism in $SrTiO_3/LaAlO_3$ Multilayers," Phys. Rev. Lett., 109: 5 pages (2012).
Bi et al., "Room-Temperature Electronically-Controlled Ferromagnetism at the $LaAlO_3/SrTiO_3$ Interface," Dept. of Phys. & Astronomy, 41 pages (Jul. 20, 2013).
Ariando et al., "Electronic phase separation at the $LaAlO_3/SrTiO_3$ interface," Nature Communications, vol. 2, No. 188, pp. 1-7 (Feb. 2011).
Mannhart et al., "Two-Dimensional Electron Gases at Oxide Interfaces," MRS Bulletin, vol. 33, pp. 1027-1034 (Nov. 2008).
Pentcheva et al., "Charge localization or itineracy at $LaAlO_3/SrTiO_3$ interfaces: Hole polarons, oxygen vacancies, and mobile electrons," The American Physical Society, vol. 370, pp. 4904-4926 (2012).
Moetakef, et al., "Carrier-Controlled Ferromagnetism in $SrTiO_3$," Physical Review X 2, pp. 021014-1-021014-2 (2012).
Yu et al., "Interface Ferromagnetism and Orbital Reconstruction in $BiFeO_3$-$La_{0.7}Sr_{0.3}MnO_3$ Heterostructures," Physical Review Letters, vol. 105(2), pp. 027201-1 to 5 (Jul. 2010).
Caviglia et al., "Electric field control of the $LaAlO_3/SrTiO_3$ interface ground state," Nature Letters, vol. 456, pp. 624-627 (2008).
Kalisky, et al., "Scanning Probe Manipulation of Magnetism at the $LaAlO_3/SrTiO_3$ Heterointerface," Nano Letters, vol. 12, pp. 4055-4059 (2012).
Derwent Abstract Translation of CN 204760385 U (published Nov. 2015).
Joshua et al., "A universal critical density underlying the physics of electrons at the $LaAlO_3/SrTiO_3$ interface," Nature Communications, vol. 3, 1-7 pages (Oct. 2012).
Schoofs Thesis (Wolfson College, Mar. 2012), 178 pages.
Joshua et al., "Gate-tunable polarized phase of two-dimensional electrons at the $LaAlO_3/SrTiO_3$ interface," PNAS, vol. 110, No. 24, pp. 9633-9638 (Jun. 2013).
Pentcheva et al., "Termination control of electronic phases in oxide thin films and interfaces: $LaAlO_3/SrTiO_3$ (001)., Philosophical Transactions of The Royal Society, vol. 370, pp. 4904-4926 (2012).

\* cited by examiner

OXIDE INTERFACE DISPLAYING ELECTRONICALLY CONTROLLABLE FERROMAGNETISM

CROSS REFERENCE TO RELATED APPLICATIONS

This application is a continuation of U.S. patent application Ser. No. 15/806,169, filed Nov. 7, 2017, granted as U.S. Pat. No. 10,490,331 on Nov. 26, 2019, which is a divisional of U.S. patent application Ser. No. 14/801,410, filed Jul. 16, 2015, granted as U.S. Pat. No. 9,852,835 on Dec. 26, 2017, which claims priority from U.S. Provisional Patent Application No. 62/025,815, filed Jul. 17, 2014, now expired. The contents of these applications are incorporated herein by reference in their entirety.

STATEMENT OF GOVERNMENT SUPPORT

This invention was made with government support under grant no. W911NF-08-1-0317 awarded by the Army Research Office, grant no. FA9550-10-1-0524 awarded by the Air Force Office of Scientific Research, and grant nos. 1104191 and 1124131 awarded by the National Science Foundation. The government has certain rights in the invention.

TECHNICAL FIELD

The present invention is generally directed to oxide interfaces and more specifically to oxide interfaces displaying electronically controlled ferromagnetism.

BACKGROUND

The two-dimensional electron liquid that forms at the interface between the two insulating non-magnetic oxides $LaAlO_3$ ("LAO") and $SrTiO_3$ ("STO") has drawn widespread attention due to its possession of a remarkable variety of emergent behavior including superconductivity, strong Rashba-like spin-orbit coupling, and ferromagnetism. See Ohtomo, A. & Hwang, H. Y., "A high-mobility electron gas at the $LaAlO_3/SrTiO_3$ heterointerface," *Nature*, 427: 423-426 (2004); Reyren et al., "Superconducting interfaces between insulating oxides." *Science*, 317: 1196-1199 (2007); Ben Shalom et al., "Tuning Spin-Orbit Coupling and Superconductivity at the $SrTiO_3/LaAlO_3$ Interface: A Magnetotransport Study," *Phys. Rev. Lett.*, 104 (2010); Brinkman, A. et al., "Magnetic effects at the interface between non-magnetic oxides." *Nature Materials*, 6: 493-496 (2007).

Despite this interest, the existence and nature of magnetism in structures comprising a LAO/STO interface has remained controversial. Neutron reflectometry measurements by Fitzsimmons et al. on LAO/STO superlattices found no magnetic signatures; their measurements established a bulk upper limit thirty times lower than what was reported by Li et al. See Fitzsimmons et al., "Upper Limit to Magnetism in $LaAlO_3/SrTiO_3$ Heterostructures," *Phys. Rev. Lett.*, 107: 217201 (2011). Salman et al. reported relatively small moments from LAO/STO superlattices ($\sim 2 \times 10^{-3}$ $\mu_B$/unit cell) using β-detected nuclear magnetic resonance. See Salman et al., "Nature of Weak Magnetism in $SrTiO_3/LaAlO_3$ Multilayers," *Phys. Rev. Lett.*, 109: 257207 (2012). As a result, control of such magnetism has remained elusive.

SUMMARY

An embodiment of the present invention provides an electronically controllable ferromagnetic oxide structure that includes at least three layers. The first layer comprises $SrTiO_3$ (STO). The second layer has a thickness of at least about 4 unit cells and preferably not more than about 99 unit cells, the thickness being in a direction substantially perpendicular to the interface between the first and second layers. The third layer is in contact with either the first layer or the second layer or both, and is capable of altering the charge carrier density at the interface between the first layer and the second layer. The interface between the first and second layers is capable of exhibiting electronically controlled ferromagnetism.

Another embodiment of the present invention provides a method of electronically weakening or removing a ferromagnetic state at an interface between a first layer and a second layer of a multi-layered oxide structure. The method comprises establishing a voltage difference between the interface and a material in contact with at least one layer of the multi-layered oxide structure, wherein the voltage difference is sufficient to increase the charge carrier density at the interface. The first layer of the oxide structure comprises STO. The second layer has a thickness of at least about 4 unit cells thick and preferably not more than about 99 unit cells, the thickness being in a direction substantially perpendicular to the interface between the first and second layers. The interface between the first and second layers of the oxide structure is capable of exhibiting electronically controlled ferromagnetization.

Another embodiment of the present invention provides a method of electronically establishing an anisotropic ferromagnetic state substantially in a direction $\vec{B}$ at an interface between a first layer and a second layer of a multi-layered oxide structure. The method comprises establishing a voltage difference between the interface and a material in contact with at least one layer of the multi-layered oxide structure, wherein the voltage difference is sufficient to decrease the charge carrier density at the interface. The step of establishing a voltage difference is performed while a magnetic field B substantially in a direction $\vec{B}$ is present at the interface between the first and second layers. The first layer of the oxide structure comprises STO. The second layer of the oxide structure has a thickness at least about 4 unit cells thick and preferably not more than about 99 unit cells, the thickness being in a direction substantially perpendicular to the interface between the first and second layers. The interface between the first and second layers of the oxide structure exhibits substantially no ferromagnetization immediately prior to the step of establishing a voltage difference.

DETAILED DESCRIPTION

The present invention provides for electronic control of ferromagnetism at oxide interfaces by making use of the fact that ferromagnetism at such interfaces depends strongly on charge carrier density at the interface. The manuscript titled "Room-Temperature Electronically-Controlled Ferromagnetism at the LaAlO$_3$/SrTiO$_3$ Interface," authored by Bi et al., available at http://arxiv.org/ftp/arxiv/papers/1307/1307.5557.pdf, is hereby incorporated by reference in its entirety. The charge carrier density at an oxide interface can be controlled using a number of techniques, including but not limited to metallic gating, reorientable ferroelectric materials, electrolytes, polar adsorbates, self-assembled monolayers, and nanoscale control using conductive atomic force microscopy lithography.

Figures 1A, 1B:
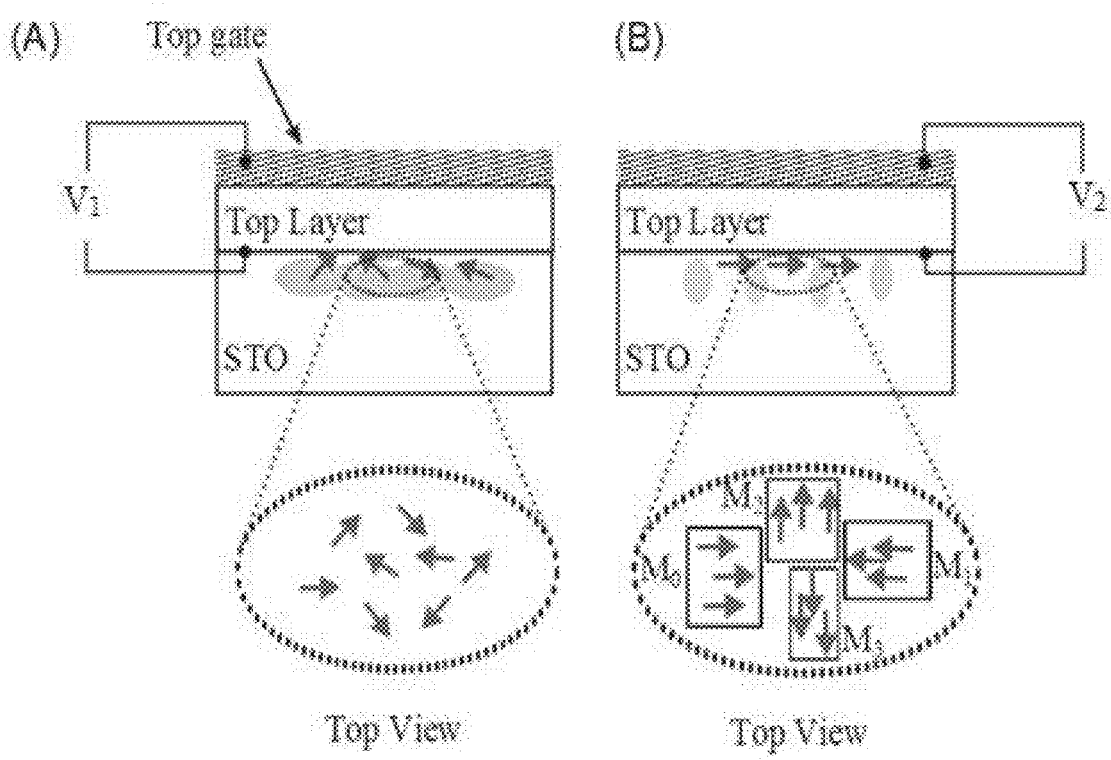
FIGS. 1A-1B depicts a top gated oxide interface. It shows the effect of applying different voltages on the in-plane ferromagnetic state of an oxide interface.

Under certain conditions described herein, depleting charge carriers (for example, electrons) from an oxide interface results in the formation of a ferromagnetic phase with defined domain walls, the ferromagnetic phase being substantially in the plane of the interface, wherein the plane is not necessarily flat. Increasing charge carrier density at the interface by introducing additional charge carriers via, for example, electrical gating, results in the weakening and/or removal of the ferromagnetic state. The added charge carriers align antiferromagnetically with the existing magnetic state, weakening it and potentially removing it. Subsequent depletion of charge carriers results in a new, uncorrelated magnetic pattern at the interface. FIG. 1A shows an oxide interface displaying a non-ferromagnetic phase, and FIG. 1B shows an oxide interface displaying a ferromagnetic phase, where $V_1$ caused an increase in charge carrier density at the interface, and $V_2$ caused a decrease in charge carrier density at the interface.

An "interface," as referred to herein, includes a plane between two layers in contact with each other, and further includes a thickness of about 4 unit cells, extending from the plane, into each layer. The interface also includes any passivation layer, such as TiO$_2$, which terminates one or both surfaces of the two layers in or around the plane of contact.

Electronically Controllable Ferromagnetic Oxide Structure

An electronically controllable ferromagnetic oxide structure can comprise, for example, a first layer and a second layer in contact with each other forming an oxide interface between the two layers. The interface is preferably, but not necessarily, flat. The structure can further comprise a third layer in contact with at least one of the first two layers. The third layer is capable of altering the charge carrier density at the oxide interface. An oxide interface capable of electronically controllable ferromagnetism can comprise, for example, the interface formed between two layers, one layer comprising STO and the other comprising at least one of LAO, LaTiO$_3$, EuTiO$_3$, Al$_2$O$_3$, GaTiO$_3$, and/or LaMnO$_3$.

In an embodiment of the present invention an oxide interface is formed between two layers, one comprising LAO and the other one comprising STO. The STO layer can be grown, for example, on a substrate (for example, on a silicon substrate). The STO layer is preferably at least 10 nm thick, and is most preferably at least 100 nm thick. The LAO layer is preferably at least about 4 unit cells thick and not more than about 99 unit cells thick, and any value in between, and is most preferably at least about 8 unit cells thick and not more than about 30 unit cells thick, and any value in between. In other embodiments, the LAO layer can be about 4, about 5, about 6, about 7, about 8, about 9, about 10, about 11, about 12, about 13, about 14, about 15, about 16, about 17, about 18, about 19, about 20, about 21, about 22, about 23, about 24, about 25, about 26, about 27, about 28, about 29, about 30, about 40, about 50, about 60, about 70, about 80, about 90 unit cells thick, or not more than about 99 unit cells thick.

In this embodiment, LAO/STO interfaces can, for example, be fabricated by depositing 12 unit cell thick LAO films on TiO$_2$-terminated [001] STO substrates using pulsed laser deposition with in situ high-pressure reflection high energy electron diffraction. The TiO$_2$ termination can serve as a passivation layer. Alternatively, a [111] or [110] STO substrate may be used. Before such laser deposition, low-miscut (less than about 0.1°) STO substrates are preferably used and are etched using buffered HF acid to keep the TiO$_2$-termination. Then the STO substrates are annealed at about 1000° C., preferably for several hours, so that substantially atomically flat surfaces are created. During the deposition, a KrF exciter laser beam with a wavelength of approximately 248 nm is preferably used and is focused on a stoichiometric LAO single crystal target with energy density of about 1.5 J/cm$^2$ and each LAO unit cell is preferably deposited by about 50 laser pulses. It is preferable to use one of two different growth conditions for the substrate growth which involve temperature and chamber background partial oxygen pressure P(O$_2$). Growth condition (1) involves T=about 550° C. and P(O$_2$)=about 10$^{-3}$ mbar; growth condition (2) involves T=about 780° C. and P(O$_2$)=about 10$^{-5}$ mbar. For samples grown in condition (2), after deposition they are preferably annealed at about 600° C. in P(O$_2$)=about 300 mbar for about one hour, which helps to minimize oxygen vacancies. Oxide growth can also, for example, be accomplished, for example, by molecular beam epitaxy, or by sputtering.

In another embodiment, a first layer and a second layer forming an oxide interface can be in contact with a third layer that is capable of altering the charge carrier density at the interface, thus forming an electronically controllable ferromagnetic oxide structure. The third layer can be in contact with only one of the first and second layers, or the third layer can be in contact with both the first and second layers. For example, the third layer may comprise a metallic electrode which is in contact with both of the layers forming an oxide interface.

The charge carriers can comprise, for example, electrons. The third layer can comprise, for example, at least one of a metallic electrode, a reorientable ferroelectric material, an electrolyte, a polar adsorbate, a self-assembled monolayer, and the tip of an atomic force microscope probe. The reorientable ferroelectric material can comprise, for example, (Pb,Zr)TiO$_3$ ("PZT").

In another embodiment, a first and second layer form an oxide interface and a third layer comprising a metallic electrode is in contact with at least one of the first and second layers. The third layer can have a voltage applied to it to establish a voltage difference between the interface and the at least one layer, thereby altering the charge carrier density at the oxide interface. Alternatively or additionally, a tip of an atomic force microscope probe, instead of a metallic electrode, can be used to apply such a voltage difference. In another embodiment, a first and second layer form an oxide interface and a third layer comprising a polar adsorbate and/or an electrolyte is in contact with at least one of the first and second layers, thereby altering charge carrier density at the interface. In another embodiment, a first and second layer form an oxide interface and a third layer comprising a ferroelectric material (for example, PZT) is in contact with at least one of the first and second layers. The ferroelectric material can be reoriented in order to alter the charge carrier density at the interface.

Figure 2:
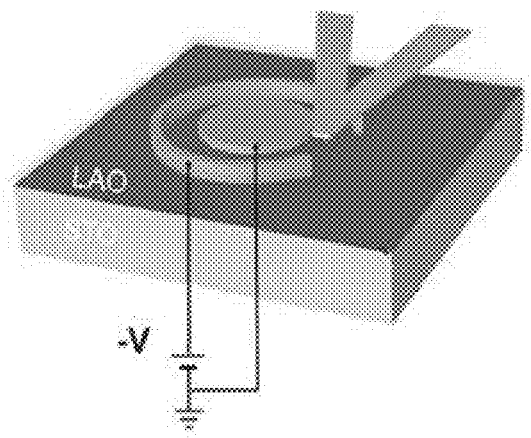
FIG. 2 depicts an LAO/STO oxide interface with a top circular electrode and an annular interfacial contact. It shows a voltage being applied between the interface and the LAO layer via those contacts.

In another embodiment, an oxide structure comprises an oxide interface formed between a first layer and a second layer, for example, a first layer of STO and a second layer of LAO, and further comprises a third layer which comprises a top metallic electrode, the third layer being in contact with the LAO layer. The oxide structure is, for example, patterned with top circular electrodes and concentric arc-shaped interfacial contacts, as shown in FIG. 2. The top circular electrodes are preferably deposited on the LAO layer on a surface substantially opposite to the LAO/STO interface via, for example, DC sputtering. The arc-shaped interfacial contacts extend through the LAO layer to the interface. They are preferably prepared by creating trenches that extend from a LAO surface substantially opposite to the LAO/STO interface through the LAO layer to the interface, via, for example, Ar-ion milling, followed by deposition of Au and Ti. Au and Ti need not necessarily be used, but Au is convenient for the wire bonding process and Ti can be useful for Au adhesion. The amount of Au and Ti deposited depends upon the thickness of the LAO layer. For example, about 4 nm of Ti and about 30 nm of Au can be deposited. In other embodiments, the amount of Ti deposited can range from about 1 to about 50 nm, and any amount in between, and the amount of Au deposited can range from about 10 to about 40 nm, and any amount in between. In other embodiments, Ti need not be deposited. A series of metallic circular top electrodes (for example, about 4 nm Ti and about 40 nm Au) are preferably deposited on a LAO surface substantially opposite to the LAO/STO interface. In other embodiments, the amount of Ti deposited can range from about 1 to about 50 nm, and any value in between, and the amount of Au deposited can range from about 10 to about 40 nm, and any amount in between. In other embodiments, Ti need not be deposited. The arc-shaped interfacial contacts can have, for example, a width of about 20 μm and fixed separation of about 50 μm to the edge of the circular top gates. In other embodiments, arc-shaped interfacial contacts have a width ranging from about 10 to about 30 μm, and any value in between, and they have fixed separation of about 25 to about 75 μm to the edge of the circular top gates, and any value in between. The entire oxide structure, which can be about 5 mm×about 5 mm×about 0.5 mm, and any value in between, can be affixed to a ceramic chip carrier using, for example, silver paint. In other embodiments, an entire oxide structure ranges from about 1 to about 10 mm×about 1 to about 10 mm×about 0.1 to about 1 mm, and any value in between. Electrical contacts to bonding pads on the device are, for example, made with an ultrasonic wire bonder using gold wires.

Method of Electronically Weakening or Removing a Ferromagnetic State at an Interface Between a First Layer and a Second Layer of a Multi-Layered Oxide Structure In another embodiment, a method for electronically weakening or removing a ferromagnetic state at an interface between the first and second layers of a multi-layer oxide structure comprises applying a voltage difference between the interface and a material in contact with at least one layer of the multi-layered oxide structure to increase the charge carrier density at the interface. For example, to increase electron density at an LAO/STO interface of an oxide structure, a top circular electrode in contact with the LAO layer on a LAO surface substantially opposite to the LAO/STO interface can be grounded, and a voltage $-V_{dc}$ can be applied to an annular interfacial contact which is deposited on the LAO surface substantially opposite to the LAO/STO interface and which extends through the LAO layer to the. Note that this configuration is equivalent to grounding the LAO/STO interface and applying $+V_{dc}$ to the top electrode. Increasing $V_{dc}$ leads to electron accumulation at the LAO/STO interface, increasing the electron density, which can result in the weakening or removing of a ferromagnetic state at the interface. When increasing the electron density at the interface, $V_{dc}$ can preferably be about 0.01 to about 15 volts, and any value in between, and can be most preferably about 0.02 to about 6 volts, and any value in between. In other embodiments, $V_{dc}$ can be about 1, about 2, about 3, about 4, about 5, about 6, about 7, about 8, about 9, about 10, about 11, about 12, about 13, about 14, or about 15 volts.

Method of Electronically Establishing an Anisotropic Ferromagnetic State at an Interface Between a First Layer and a Second Layer of a Multi-Layered Oxide Structure In another embodiment, a method of electronically establishing an anisotropic ferromagnetic state substantially in a direction $\vec{B}$ at an interface between the first and second layers of a multi-layered oxide structure comprises applying a voltage difference between the interface and a material in contact with at least one layer of the multi-layered oxide structure to decrease the charge carrier density at the interface, where the interface between the first and second layers of the oxide structure exhibited substantially no ferromagnetization immediately prior to the step of applying a voltage difference. The interface preferably exhibited less ferromagnetization than a background magnetic field B described below. For example, to decrease electron density at an LAO/STO interface of an oxide structure, a top circular electrode in contact with the LAO layer on a surface substantially opposite to the LAO/STO interface can be grounded, and a voltage $-V_{dc}$ can be applied to an annular interfacial contact which is also on the LAO layer on a surface substantially opposite to the LAO/STO interface. Note that this configuration is equivalent to grounding the interface and applying $+V_{dc}$ to the top electrode. Decreasing $V_{dc}$ depletes the interface of electrons, decreasing the electron density, which can result in the formation of a ferromagnetic state at the interface. The decreasing of electron density at the interface should be performed while a background magnetic field B substantially in a direction $\vec{B}$ is present at the interface between the two layers to have the newly formed ferromagnetic state be substantially in the $\vec{B}$ direction. The magnetic field B is preferably about 0.01 oersted to about 100 oersted, and any value in between, and is most preferably about 0.02 oersted to about 10 oersted, and any value in between. In other embodiments, the magnetic field B can be about 1, about 2, about 3, about 4, about 5, about 6, about 7, about 8, about 9, about 10, about 20, about 30, about 40, about 50, about 60, about 70, about 80, about 90, or about 100 oersted. When decreasing the electron density at the interface, $V_{dc}$ is preferably about −0.01 to about −15 volts, and any value in between, and is most preferably about −0.02 to about −6 volts, and any value in between. In other embodiments, $V_{dc}$ can be about −1, about −2, about −3, about −4, about −5, about −6, about −7, about −8, about −9, about −10, about −11, about −12, about −13, about −14, or about −15 volts.

Working Conditions

Figure 3:
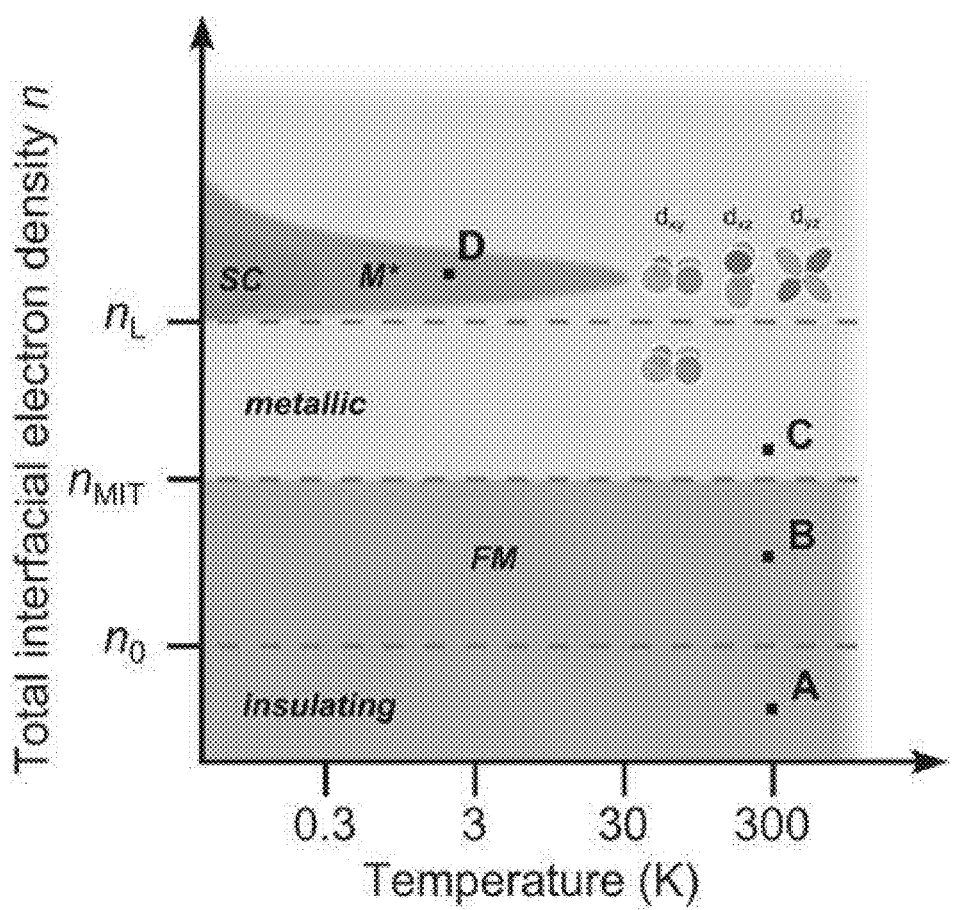
FIG. 3 depicts a phase diagram showing charge carrier density and temperature dependence of a ferromagnetic state at an oxide interface. The phase diagram is a very rough approximation, and any numbers shown therein are not necessarily accurate.

The above described methods are preferably performed at certain charge carrier density ranges. FIG. 3 shows a phase diagram displaying some temperature dependence and interfacial electron density dependence of an oxide interface's ability to display ferromagnetism. Note that FIG. 3 does not precisely characterize this relationship and serves only as a very rough guide to the present discussion. The above described methods are preferably performed using an oxide interface that is in phase B or C of the phase diagram. Phase B represents the ferromagnetic state. The trend shown in the diagram is that the higher the temperature of an oxide structure, the smaller the range of acceptable carrier densities for ferromagnetism. At too high a temperature, no ferromagnetic state exists. Thus, the temperature is preferably below about 450 Kelvin, and more preferably below about 320 Kelvin. The temperature can also be any value lower than 450 Kelvin. When charge carrier density is too low (i.e. in phase A of the phase diagram), ferromagnetism will probably not be supported and decreasing charge carrier density will probably not lead to the formation a ferromagnetic state. Thus the LAO layer is preferably at least about 4 unit cells thick to help ensure a sufficient number of charge carriers. The LAO layer can also be a larger unit cell thickness as described herein.

Additionally, there is a type of magnetic state that might not be susceptible to the methods described herein for weakening or removing a ferromagnetic state. This magnetic state can be achieved when charge carrier density is high and when the temperature is low (i.e. phase D of the phase diagram). When an oxide interface is in such a state, increasing charge carrier density might not weaken or remove the magnetic state. Thus the temperature is preferably at least about 40 Kelvin. The temperature can also be higher than 40 Kelvin.

Memory Device

Materials with a ferromagnetic state can exhibit various domain structures, with the local magnetization taking on one of several discrete directions $\vec{M}=\vec{M}_0, \vec{M}_1 \ldots \vec{M}_n$. Regarded as a memory device, these n different states can store $\log_2(n)$ bits of information. An embodiment of the present invention allows for the formation of, and/or electronic control of, such ferromagnetic states and can be employed towards a memory device. See FIG. 1.

Figure 4:
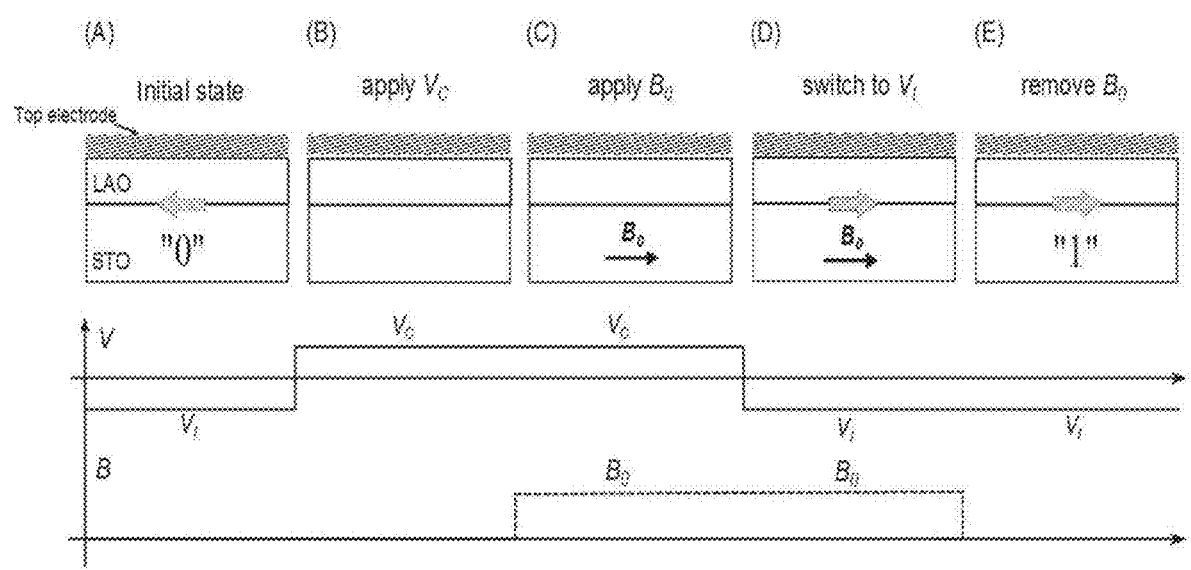
FIG. 4 depicts a method of switching a memory state from state "0" to state "1".

FIG. 4 illustrates a method for reversible orientation of ferromagnetic states, based upon an embodiment of the present invention that comprises metallically top-gated LAO/STO oxide structures. Such an oxide structure, which can serve as a memory device, can be fabricated, for example, from a two-layer oxide structure that comprises an LAO/STO interface by depositing a conducting top layer onto the LAO layer on a surface substantially opposite to the LAO/STO interface.

A magnetic bit state can be defined for the memory device, for example, according to a magnetic moment orientation of a ferromagnetic domain found at the LAO/STO interface: the magnetic bit state can be said to be in state "0" when the magnetic moment is pointing in one direction substantially in the plane of LAO/STO interface, and it can be said to be in state "1" when the magnetic moment is pointing substantially in the opposite direction.

To change such a magnetic bit state from "0" (FIG. 4A) to "1", a positive voltage $V_C$ is first applied to the conducting top layer (where $V_C$ is gauged relative to the voltage at the interface) to weaken or remove the ferromagnetic state corresponding to "0" by increasing charge carrier density at the interface (FIG. 4B). The voltage $V_C$ can be preferably about 0.01 to about 15 volts, and any value in between, and can be most preferably about 0.02 to about 6 volts, and any value in between. In other embodiments, $V_{dc}$ can be about 1, about 2, about 3, about 4, about 5, about 6, about 7, about 8, about 9, about 10, about 11, about 12, about 13, about 14, or about 15 volts.

Next, a small external magnetic field $B_o$ substantially in a direction $\vec{B}$ corresponding to "1" is applied (FIG. 4C), which will help to set the magnetization orientation in a later step. The small external magnetic field applied can be applied globally and may, but need not, be confined only to the memory device being switched for purposes of switching the magnetic bit state of the memory device. However, it may be desirable to so confine the magnetic field. The small external magnetic field is preferably about 0.01 oersted to about 100 oersted, and any value in between, and is most preferably about 0.02 oersted to about 10 oersted, and any value in between. In other embodiments, the magnetic field $B_o$ can be about 1, about 2, about 3, about 4, about 5, about 6, about 7, about 8, about 9, about 10, about 20, about 30, about 40, about 50, about 60, about 70, about 80, about 90, or about 100 oersted.

Next, the voltage applied to the conducting top layer relative to the interface is switched to a negative gate voltage $V_I$ to form a new ferromagnetic state at the LAO/STO interface by decreasing the charge carrier density at the oxide interface. The voltage $V_I$ is preferably about −0.01 to about −15 volts, and any value in between, and is most preferably about −0.02 to about −6 volts, and any value in between. In other embodiments, $V_{dc}$ can be about −1, about −2, about −3, about −4, about −5, about −6, about −7, about −8, about −9, about −10, about −11, about −12, about −13, about −14, or about −15 volts. The new ferromagnetic state's magnetization orientation will be substantially aligned with $\vec{B}$, which corresponds with state "1" (FIG. 4D). The small external magnetic field can then be removed and the bit state "1" is stored (FIG. 4E). During this operation, the step of switching to a positive gate voltage to weaken or remove the ferromagnetic state and the step of applying a small external magnetic field $\vec{B}$ can be performed simultaneously or in reverse order, and those steps can overlap. Preferably, these steps are performed before the step of decreasing the charge carrier density at the oxide interface is performed.

To read out such a magnetic bit state, a variety of methods can be used such as, for example, magnetic force microscopy, Hall sensor, and giant magnetoresistance head.

Cross-Bar Array

Figure 5:
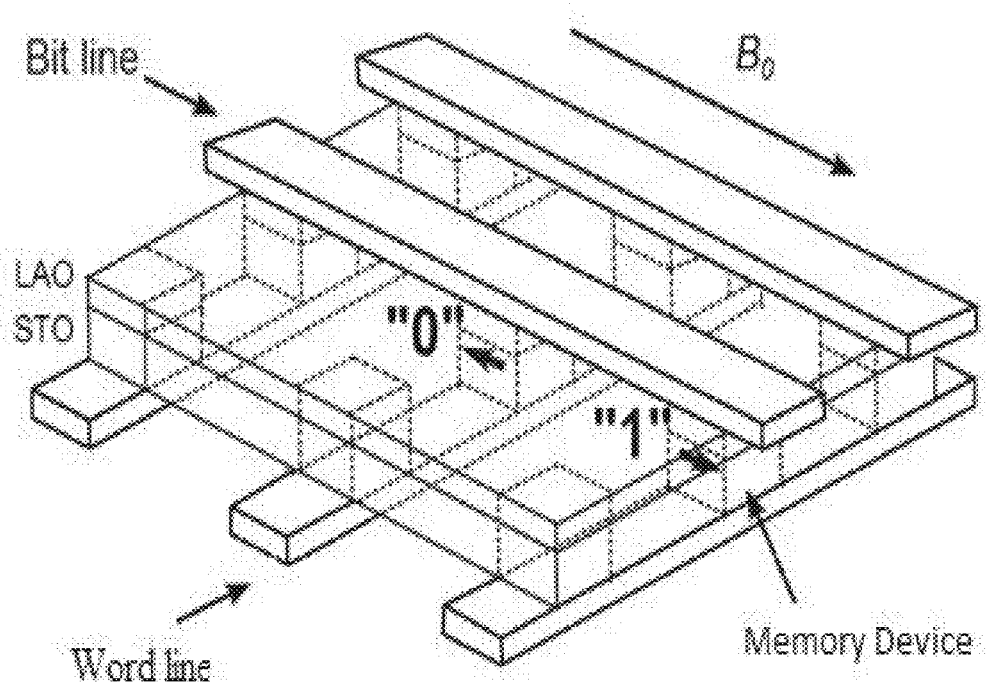
FIG. 5 depicts a cross-bar array of memory devices having various memory states, as well as word lines and bit lines.

Based on the above memory device concept, a cross-bar array of memory devices can be formed (FIG. 5) which allows convenient electronic control of a large number of memory devices. An embodiment of such a cross bar array comprises a plurality of memory devices comprising electronically controllable ferromagnetic oxide structures, each oxide structure comprising at least three layers. The first layer comprises STO. The second layer is in contact with the first layer and comprises, for example, LAO. The second layer is preferably no less than about 4 unit cells thick and not more than about 99 unit cells thick in a direction substantially perpendicular to the interface between the first and second layers, and is most preferably no less than 8 unit cells thick and not more than 30 unit cells thick. Other unit cell thicknesses can be used as described herein. A ferromagnetic state at the interface between the first and second layers defines the magnetic bit state of the memory device.

The third layer is capable of altering the charge carrier density at the interface between the first and second layers and can comprise, for example, a metallic electrode. Within the cross-bar array, memory devices can preferably be spaced between about 2 nm apart to about 300 nm apart, and any value in between, and can most preferably be spaced between about 10 nm apart to about 100 nm apart, and any value in between.

The embodiment further comprises a plurality of bit lines which are substantially parallel to one another and are substantially disposed in a first plane. The bit lines can be, for example, conductive. A bit line can, for example, comprise a layer of a first material and a layer of a second material that is different from the first material. For example, a bit line can comprise a first metallic layer and a second coating layer over the metallic layer. The third layer of each oxide structure comprises at least a portion of at least one bit line such that, for example, the third layer of an oxide structure comprises a portion of a bit line comprising a metallic layer of the bit line and a coating layer of the bit line. The third layer of each oxide structure serves as a metallic electrode capable of altering the charge carrier density at the interface between the first and second layers of the oxide structure.

The embodiment may further comprise a plurality of word lines that are substantially parallel to one another and are substantially disposed in a second plane, wherein the first plane is substantially parallel to the second plane, and each bit line is substantially perpendicular to each word line. Furthermore, at least one of the layers of each oxide structure is in contact with at least one word line. The word line can, for example, offer structural support and/or can serve as an electrode.

This embodiment allows for electronic control over memory devices that comprise, for example, an LAO/STO interface. It allows for, among other things, establishing a voltage difference between the LAO/STO interface and a bit line in contact with the LAO layer. Such a voltage difference can be used to switch a memory state in the manner described above. In a similar manner, a word line can additionally or alternatively be used for purposes of electronically controlling memory devices. Either or both of a word line or a bit line can be alternatively or additionally used for structural support for the cross-bar array. Thus, convenient electronic control over a large number of memory devices can be achieved.

As used herein, the term "about" will be understood by persons of ordinary skill in the art and will vary to some extent depending upon the context in which it is used. If there are uses of the term which are not clear to persons of ordinary skill in the art given the context in which it is used, then "about" will mean up to plus or minus 10% of the particular term.

All publicly available documents referenced herein, including but not limited to U.S. patents, are specifically incorporated by reference.

It will be apparent to those skilled in the art that various modifications and variations can be made in the methods and compositions of the present invention without departing from the spirit or scope of the invention. Thus, it is intended that the present invention cover the modifications and variations of this invention provided they come within the scope of the appended claims and their equivalents.

What is claimed is:

1. An electronically controllable ferromagnetic oxide structure comprising:

(a) a first layer comprising $SrTiO_3$;

(b) a second layer in contact with the first layer, wherein the second layer has a thickness of at least about 4 unit cells, the thickness being in a direction substantially perpendicular to an interface between the first and the second layers, wherein the interface is defined by a plane between the first and second layers; and (c) at least one surface electrode and at least one interfacial contact, the at least one surface electrode and the at least one interfacial contact being in contact with at least one of the first layer or the second layer, wherein the at least one surface electrode and the at least one interfacial contact are configured to alter the charge carrier density at the interface between the first and second layers, wherein the at least one surface electrode is deposited on the second layer on a surface spaced from the interface, and the at least one interfacial contact extends from the surface spaced from the interface through the second layer to the interface, and wherein the interface between the first and the second layers is configured to (i) exhibit electronically controlled ferromagnetism in response to alteration of the charge carrier density, and (ii) switch between a ferromagnetic state and a non-ferromagnetic state.

2. The structure of claim 1, wherein the second layer comprises at least one of $LaAlO_3$, $LaTiO_3$, $EuTiO_3$, $Al_2O_3$, $GaTiO_3$, or $LaMnO_3$.

3. The structure of claim 1, wherein the interface comprises a $TiO_2$-terminated [001] $SrTiO_3$ surface.

4. The structure of claim 1, wherein the at least one surface electrode comprises at least one of Ti or Au.

5. A cross-bar array comprising:

(a) a plurality of oxide structures of claim 1;

(b) a plurality of bit lines that are substantially parallel to one another and are substantially disposed in a first plane; and (c) a plurality of word lines that are substantially parallel to one another and are substantially disposed in a second plane, wherein:
the first plane is substantially parallel to the second plane;

(ii) each bit line is substantially perpendicular to each word line;

(iii) the at least one surface electrode of each oxide structure comprises at least a portion of at least one bit line, and (iv) at least one of the layers of each oxide structure is in contact with at least one word line.

6. The cross-bar array of claim 5, wherein:

(a) at least one bit line comprises a layer of a first material and a layer of a second material that is different from the first material;

(b) the at least one surface electrode of the at least one oxide structure comprises at least a portion of the at least one bit line.

7. The structure of claim 1, wherein the at least one interfacial contact is an arcuate contact disposed so as to be arranged concentrically around at least a portion of the at least one surface electrode.

8. The structure of claim 1, wherein the at least one surface electrode comprises a plurality of metallic circular top electrodes disposed in series.

9. The structure of claim 1, wherein the at least one surface electrode is grounded.

10. A method of altering a ferromagnetic state at an interface of a multi-layered oxide structure comprising at least a first layer and a second layer, the method comprising:

establishing a voltage difference between the interface and a material in contact with at least one of the layers of the multi-layered oxide structure, the interface being between the first and second layers of the oxide structure and defined by a plane between the first and second layers, wherein:

(a) the voltage difference is sufficient to alter a charge carrier density at the interface between the first and second layers of the oxide structure;

(b) the first layer comprises $SrTiO_3$;

(c) the second layer has a thickness of at least about 4 unit cells, the thickness being in a direction substantially perpendicular to the interface between the first and second layers;

(d) the oxide structure further comprises at least one surface electrode and at least one interfacial contact, the at least one surface electrode and the at least one interfacial contact being in contact with at least one of the first layer or the second layer, and (e) the interface between the first and second layers of the oxide structure is capable of exhibiting electronically controlled ferromagnetism, wherein the at least one surface electrode is deposited on the second layer on a surface spaced from the interface, and the at least one interfacial contact extends from the surface spaced from the interface through the second layer to the interface.

11. The method of claim 10, wherein:

(a) the voltage difference is about 0.01 to about 15 volts; and (b) the voltage applied to the material in contact with the at least one layer is greater than the voltage applied to the interface.

12. The method of claim 11, wherein the at least one surface electrode comprises at least one of Ti or Au.

13. The method of claim 10, wherein the interface comprises a $TiO_2$-terminated [001] $SrTiO_3$ surface.

14. The method of claim 10, wherein the second layer comprises at least one of $LaAlO_3$, $LaTiO_3$, $EuTiO_3$, $Al_2O_3$, $GaTiO_3$, or $LaMnO_3$.

15. The method of claim 10, wherein the at least one interfacial contact is an arcuate contact disposed so as to be arranged concentrically around at least a portion of the at least one surface electrode.

16. The method of claim 10, further comprising grounding the at least one surface electrode.

17. The method of claim 10, wherein establishing the voltage difference comprises:

(a) grounding the at least one surface electrode, and (b) applying a voltage to the at least one interfacial contact so as to increase electron accumulation at the interface.

* * * * *